United States Patent
Tsai

(10) Patent No.: US 10,804,189 B2
(45) Date of Patent: Oct. 13, 2020

(54) POWER DEVICE PACKAGE STRUCTURE

(71) Applicant: ACTRON TECHNOLOGY CORPORATION, Taoyuan (TW)

(72) Inventor: Hsin-Chang Tsai, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/153,831

(22) Filed: Oct. 8, 2018

(65) Prior Publication Data
US 2020/0013705 A1  Jan. 9, 2020

(30) Foreign Application Priority Data
Jul. 4, 2018  (TW) .............................. 107123198 A

(51) Int. Cl.
| H01L 23/36 | (2006.01) |
| H01L 23/498 | (2006.01) |
| H01L 23/00 | (2006.01) |
| H01L 23/367 | (2006.01) |

(52) U.S. Cl.
CPC ...... *H01L 23/49822* (2013.01); *H01L 23/367* (2013.01); *H01L 24/45* (2013.01); *H01L 2224/48137* (2013.01); *H01L 2224/48245* (2013.01); *H01L 2924/13055* (2013.01); *H01L 2924/13064* (2013.01); *H01L 2924/13091* (2013.01); *H01L 2924/181* (2013.01)

(58) Field of Classification Search
CPC ................ H01L 23/49822; H01L 2224/48137
See application file for complete search history.

(56) References Cited

U.S. PATENT DOCUMENTS

| 8,148,817 | B2 | 4/2012 | Herbert | |
| 8,456,141 | B2* | 6/2013 | Chang | H01L 23/49503 257/777 |
| 9,666,511 | B2* | 5/2017 | Huang | H01L 23/49575 |
| 2008/0304305 | A1* | 12/2008 | Chang | H01L 25/16 363/147 |

(Continued)

FOREIGN PATENT DOCUMENTS

| CN | 101859755 | 10/2010 |
| CN | 102171825 | 8/2011 |

(Continued)

OTHER PUBLICATIONS

"Office Action of Taiwan Counterpart Application", dated Nov. 14, 2018, p. 1-p. 6.

*Primary Examiner* — Fernando L Toledo
*Assistant Examiner* — Valerie N Newton
(74) *Attorney, Agent, or Firm* — JCIPRNET

(57) ABSTRACT

A package structure of a power device includes a substrate having a first circuit, a first power device, a second power device, an insulation film having a second circuit, at least one electronic component, and a package. The first power device, the second power device, and the insulation film are disposed on the substrate. The first power device and the second power device are directly electrically connected to each other via the first circuit of the substrate. The electronic component is disposed on the insulation film. The package encapsulates the substrate, the first power device, the second power device, and the electronic component.

15 Claims, 3 Drawing Sheets

(56) References Cited

U.S. PATENT DOCUMENTS

| | | | | |
|---|---|---|---|---|
| 2014/0085830 A1* | 3/2014 | Fukuda | ............... | H01L 51/529 |
| | | | | 361/720 |
| 2015/0042159 A1* | 2/2015 | Kim | ............... | B60L 1/003 |
| | | | | 307/10.1 |
| 2015/0173248 A1* | 6/2015 | Zeng | ............... | H05K 7/1432 |
| | | | | 361/709 |
| 2016/0315184 A1* | 10/2016 | Ishimaru | ............... | H01L 24/37 |
| 2019/0020272 A1* | 1/2019 | Disney | ............... | H02M 3/06 |

FOREIGN PATENT DOCUMENTS

| | | |
|---|---|---|
| TW | I578454 | 4/2017 |
| TW | 201721817 | 6/2017 |
| TW | 201732968 | 9/2017 |
| TW | 201742543 | 12/2017 |

* cited by examiner

POWER DEVICE PACKAGE STRUCTURE

CROSS-REFERENCE TO RELATED APPLICATION

This application claims the priority benefits of Taiwan application serial no. 107123198, filed on Jul. 4, 2018. The disclosure of which is hereby incorporated by reference herein in its entirety.

BACKGROUND

Technical Field

The disclosure is related to a package, and more particularly, to a power device package structure.

Description of Related Art

A power device package structure can be applied to a rectifier, a vehicle generator or a high-power module generator. In the technical field of vehicle generators, a rectifier bridge is commonly disposed for AC-DC conversion. The rectifier bridge may be composed of power devices and configured to provide a rectified voltage as a basis for driving a load.

Currently, the upper and lower bridge devices in a half-bridge power module are mostly connected using an interconnect. However, it may generate excessive parasitic inductance by connecting the power devices using the interconnect, thus affecting power module response. Moreover, to achieve insulation between the power device and the control circuit, an insulating substrate is currently used as a carrier plate of the control circuit to isolate the power device and the control circuit. However, the heat dissipation of the insulating substrate is poor, and the thermal resistance of the power module is indirectly increased. Therefore, how to reduce the parasitic inductance and thermal resistance of the power device package structure is an important topic.

SUMMARY

The disclosure provides a power device package structure that can reduce the parasitic inductance of the power device package structure and reduce the thermal resistance of the power device package structure at the same time.

A package structure of a power device of the invention includes a substrate, a first power device, a second power device, an insulation film, at least one electronic component, and a package. The substrate has a first circuit. The first power device and the second power device are disposed on the substrate. The first power device and the second power device are directly electrically connected to each other via the first circuit of the substrate. The insulation film is disposed on the substrate and has a second circuit. The electronic component is disposed on the insulation film. The package encapsulates the substrate, the first power device, the second power device, and the at least one electronic component.

In an embodiment of the disclosure, the electronic component includes a control IC, a protection circuit, an inductor, a capacitor, or a resistor.

In an embodiment of the disclosure, the power device package structure can further include a plurality of conductors electrically connecting the electronic component to the first power device or the second power device.

In an embodiment of the disclosure, the conductor is a metal wire or a metal plate.

In an embodiment of the disclosure, the first or second power device is a vertical power device.

In an embodiment of the disclosure, the first or second power device includes a field effect transistor controlled by voltage or current.

In an embodiment of the disclosure, the first or second power device includes a metal oxide semiconductor field effect transistor (MOSFET), an insulated gate bipolar transistor, or a high-electron mobility transistor.

In an embodiment of the disclosure, the first power device and the second power device form a bridge circuit such as a half-bridge circuit, a full-bridge circuit, or a totem pole circuit.

In an embodiment of the disclosure, at least one of the first and second power devices is disposed on the substrate via a flip chip bonding technology.

In an embodiment of the disclosure, the material of the substrate includes copper, aluminum, lithium, gold, silver, diamond, graphene, or an alloy compound thereof.

In an embodiment of the disclosure, in the power device package structure, a base can be further disposed below the substrate, wherein the heat capacity of the base is greater than the heat capacity of the substrate.

In an embodiment of the disclosure, the material of the base includes copper, aluminum, lithium, gold, silver, diamond, graphene, or an alloy compound thereof.

In an embodiment of the disclosure, a portion of the base is exposed from the package.

In an embodiment of the disclosure, the power device package structure can be applied to a power conversion unit such as a rectifier, an inverter, or a converter.

In an embodiment of the disclosure, the power device package structure can be applied in a vehicle power conversion system such as a vehicle generator rectifier, a DC power converter, or a motor drive apparatus.

Based on the above, in the disclosure, the first power device and the second power device are directly disposed on the substrate having the first circuit, and therefore parasitic inductance generated between power devices can be reduced in comparison with that connected using an interconnect. Moreover, if a high thermal conductivity substrate is used, then the thermal resistance of the power device package structure under prolonged AC-DC conversion can be reduced. Moreover, an insulation film is disposed below the electronic component, and therefore the effect of electric insulation between the substrate and the electronic component can be achieved. Moreover, if a base having high heat capacity is disposed below the substrate, then high heat generated by a surge voltage which is transiently generated after shutting down a load current may be quickly absorbed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
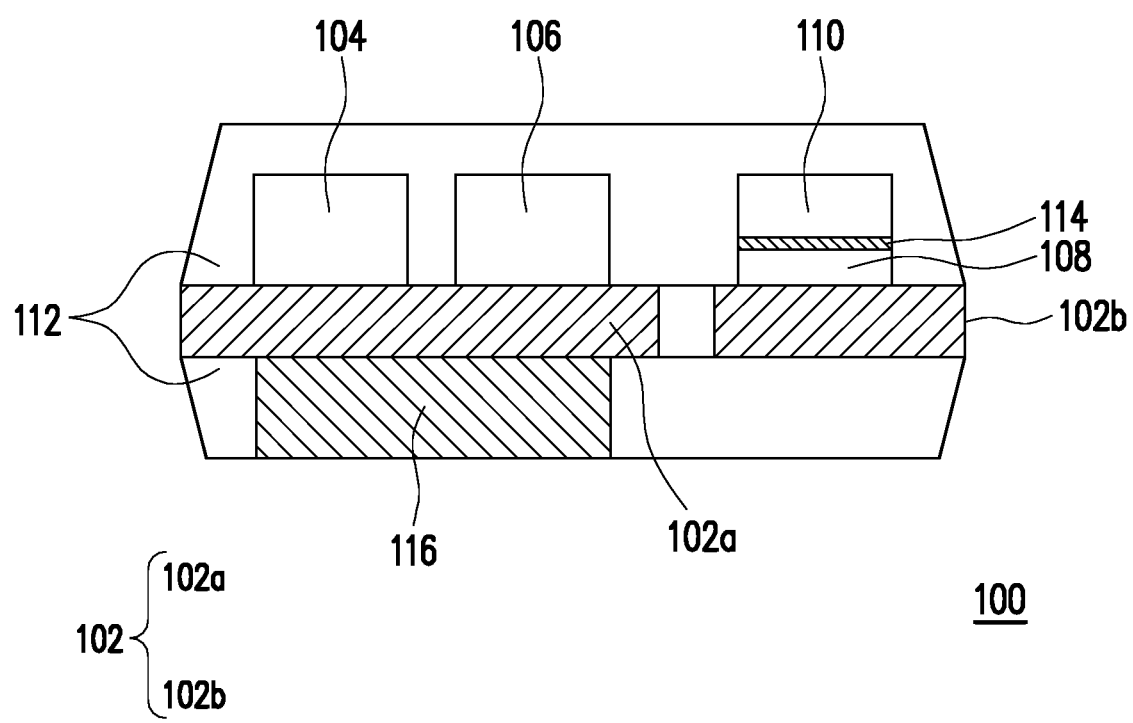
FIG. 1 is a schematic cross-sectional view of a power device package structure according to an embodiment of the disclosure

A description accompanied with drawings is provided below. However, the disclosure may still be implemented in many other different forms and should not be construed as limitations to the embodiments described hereinafter. In the drawings, each area, each portion and a size and a thickness of each layer may not be illustrated according to actual proportions. For convenient comprehension, the same elements are labeled by the same referral symbols in the following description.

FIG. 1 is a schematic cross-sectional view of a power device package structure according to an embodiment of the disclosure Referring to FIG. 1, a package structure 100 of a power device of the present embodiment substantially includes a substrate 102, a first power device 104, a second power device 106, an insulation film 108, an electronic component 110, and a package 112. The material of the substrate 102 can be a material having high thermal conductivity such as copper, aluminum, lithium, gold, silver, diamond, graphene, or an alloy compound thereof. The substrate 102 of the present embodiment has a first circuit, and if the substrate 102 is intrinsically conductive, then the first circuit can be a circuit formed by, for instance, blocks 102a and 102b of the substrate 102 itself. The first power device 104 and the second power device 106 are disposed on the substrate 102 and directly electrically connected to each other via a first circuit (not shown) of the substrate 102. For instance, at least one of the first power device 104 and the second power device 106 is disposed on the substrate via a flip chip bonding technology. The first power device 104 or the second power device 106 can be a field effect transistor controlled by voltage or current such as a MOSFET or an insulated gate bipolar transistor; or a high-electron mobility transistor such as a gallium nitride transistor or a gallium oxide transistor. Since the first power device 104 and the second power device 106 are directly disposed on the substrate 102 having a first circuit, the parasitic inductance generated between the first and the second power devices 104 and 106 is lower than that generated by traditionally connecting power devices using an interconnect. Moreover, if a high thermal conductivity substrate 102 is used, then the thermal resistance of the power device package structure 100 under prolonged AC-DC conversion can be reduced. The first power device 104 or the second power device 106 is, for instance, a vertical power device, and forms a bridge circuit such as a half-bridge circuit, a full-bridge circuit, or a totem pole circuit. The power device package structure 100 of the present embodiment can be applied in a power conversion unit, including a rectifier, an inverter, or a converter. The power device package structure 100 of the present embodiment can also be applied in a vehicle power conversion system such as a vehicle generator rectifier, a DC power converter, or a motor drive apparatus.

The insulation film 108 is disposed on the substrate 102 and has a second circuit 114. In the present embodiment, the block 102b on which the insulation film 108 is located and the block 102a on which the first power device 104 and the second power device 106 are located are isolated from each other. In another embodiment, the insulation film 108 can be disposed on the same block as the first power device 104 and the second power device 106. The material of the insulation film 108 is, for instance, an electrical insulation material such as silicon oxide, silicon nitride, a polymer compound, or a ceramic material. The electronic component 110 is disposed on the insulation film 108. The electronic component 110 is, for instance, a control IC, a protection circuit, an inductor, a capacitor, or a resistor. The insulation film 108 in the present embodiment can electrically isolate the electronic component 110 and the block 102b below, and therefore can be indirectly electrically insulated from the first power device 104 and the second power device 106. Moreover, the insulation film 108 can also prevent the transfer of heat generated by the operation of the first power device 104 or the second power device 106 to the electronic component 110 at the same time. The package 112 of the present embodiment encapsulates the substrate 102, the first power device 104, the second power device 106, and the electronic component 110. The material of the package 112 is, but not limited to, for instance, an epoxy resin, a silicone resin, a biphenyl resin, an unsaturated polyester, or a ceramic material.

Moreover, a base 116 having high heat capacity can further be disposed in the power device package structure 100 of the present embodiment. The base 116 is disposed below the substrate 102, and is preferably disposed right below the first power device 104 and the second power device 106. In an embodiment, the heat capacity of the base 116 is greater than the heat capacity of the substrate 102, and the material thereof is, for instance, copper, aluminum, lithium, gold, silver, diamond, graphene, or an alloy compound thereof; preferably aluminum or an aluminum alloy. Since the base 116 has high heat capacity, the heat generated by the surge voltage which is transiently generated after shutting down a load current may be quickly absorbed by the base 116 to reduce the junction temperature of the first power device 104 and the second power device 106. In an embodiment, the substrate 102 and the base 116 can be in direct contact with each other, and in another embodiment, a conductive adhesive layer (not shown) can be disposed between the substrate 102 and the base 116. When the base 116 is provided, the package 112 also encapsulates the base 116, and a portion of the base 116 can be exposed from the package 112.

Figure 2A:
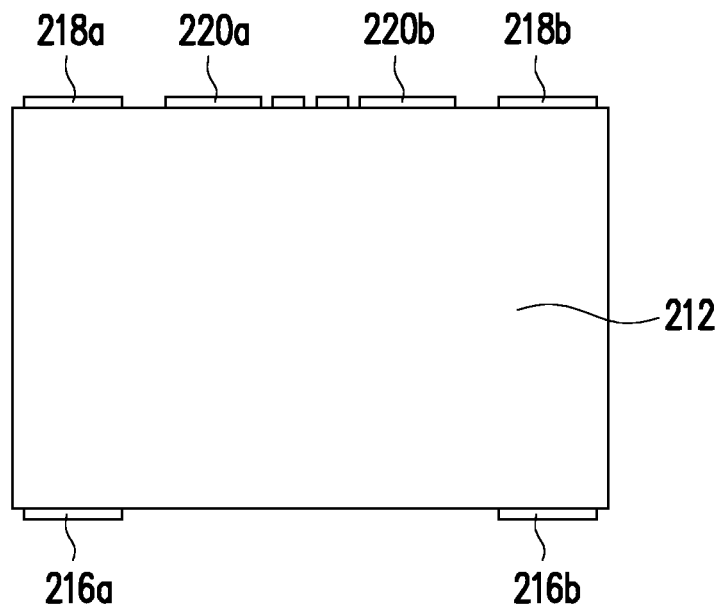
FIG. 2A is a schematic front view of a power device package structure according to another embodiment of the disclosure.
Figure 2B:
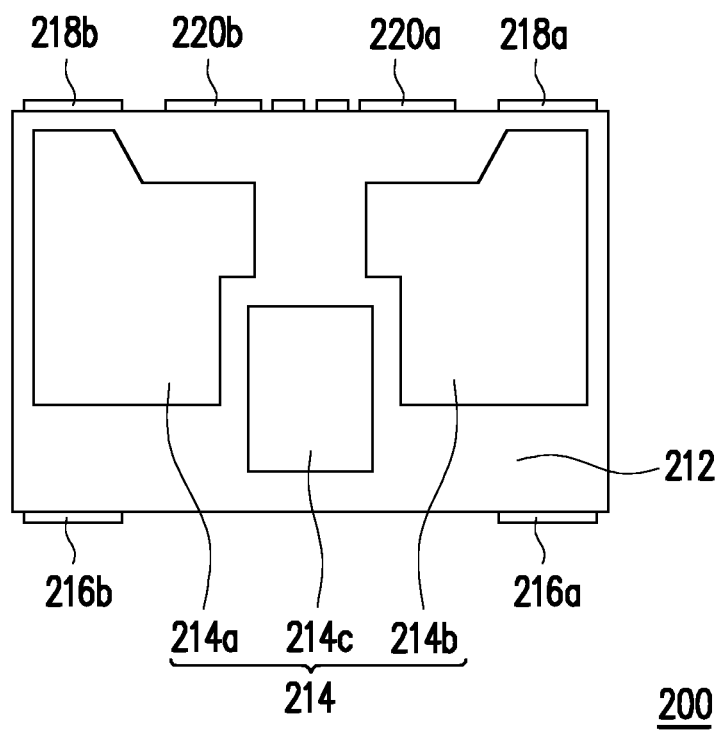
FIG. 2B is a schematic rear view of FIG. 2A.
Figure 3:
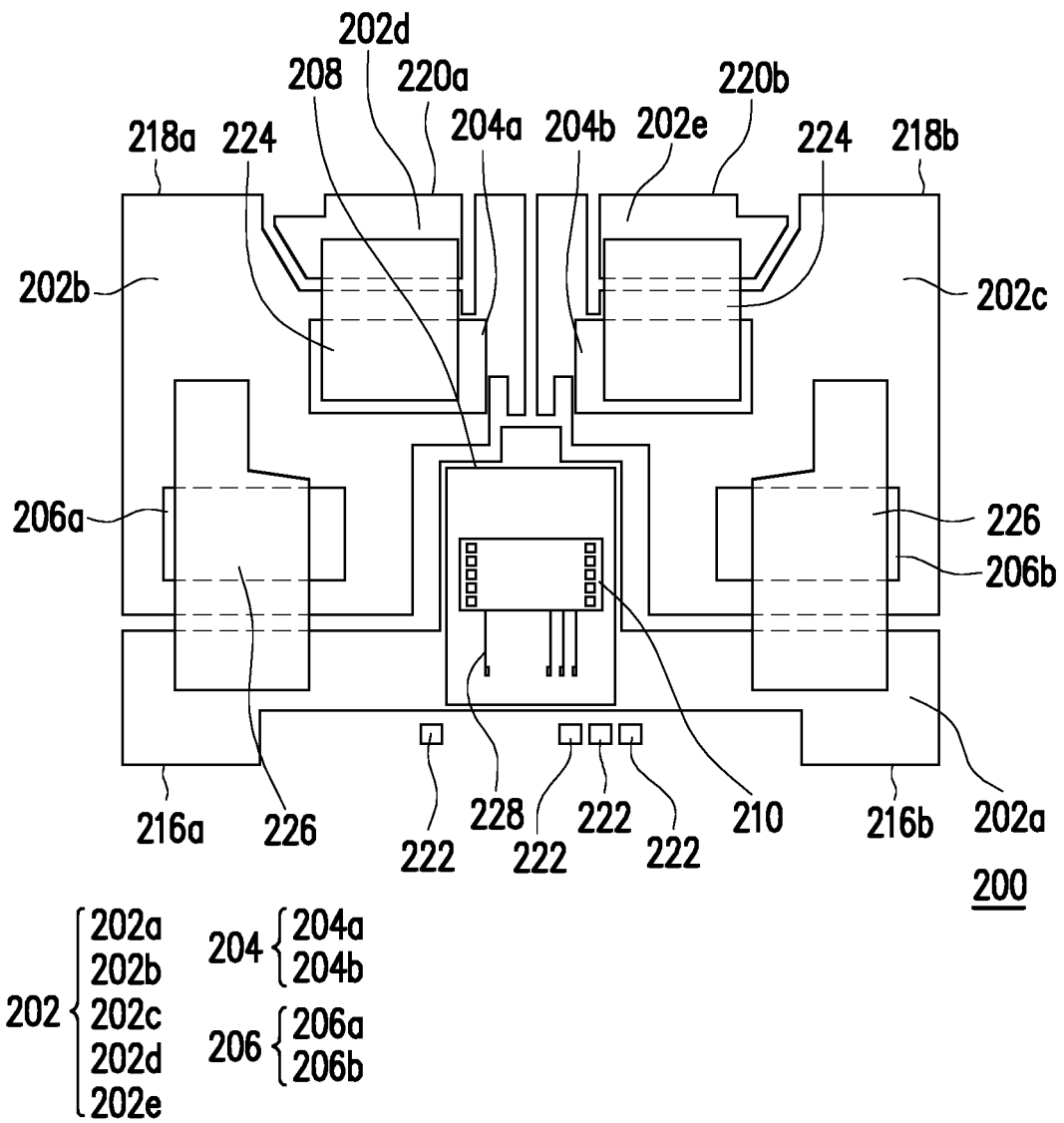
FIG. 3 is a perspective view of the power device package structure depicted in FIG. 2A.

FIG. 2A is a schematic front view of a power device package structure according to another embodiment of the disclosure, and FIG. 2B is a schematic rear view of FIG. 2A. FIG. 3 is a perspective view of the power device package structure depicted in FIG. 2A, wherein a package is omitted for showing the front structure of a power device package structure more clearly.

Referring to FIG. 2A, FIG. 2B and FIG. 3 simultaneously, a power device package structure 200 of the present embodiment substantially includes a substrate 202, a first power device 204, a second power device 206, an insulation film 208, at least one electronic component 210, and a package 212. The power device package structure 200 in the present embodiment can also have a base 214, the base 214 is disposed below the substrate 202, and the substrate 202 can be directly in contact with the base 214. In the present embodiment, the base 214 has three blocks 214a, 214b, and 214c. The material of the substrate 102 can be a material having high thermal conductivity such as copper, aluminum, lithium, gold, silver, diamond, graphene, or an alloy compound thereof. The heat capacity of the base 214 is, for instance, greater than the heat capacity of the substrate 202, and the material thereof includes copper, aluminum, lithium, gold, silver, diamond, graphene, or an alloy compound thereof; preferably aluminum or an aluminum alloy. Since the base 214 has high heat capacity, the base 116 can rapidly absorb the thermal energy generated by the surge voltage instantly generated after load current is removed so as to reduce the junction temperature of the first power device 204 and the second power device 206 to achieve the effect of reduced transient-state thermal resistance.

The substrate 202 in the present embodiment can be formed by a plurality of first circuits 202a to 202e isolated from one another, wherein the first circuit 202a has reference ground pins 216a and 216b, the first circuit 202b has a phase output pin 218a, the first circuit 202c has a phase output pin 218b, the first circuit 202d has a power pin 220a, and the first circuit 202e has a power pin 220b. In particular, the power pins 220a and 220b can be coupled to a vehicle battery, the phase output pins 218a and 218b respectively generate a plurality of rectified signals, and the reference ground pins 216a and 216b can be coupled to a reference ground terminal. When the package 212 encapsulates the first substrate 202, the first power device 204, the second power device 206, the electronic component 210, and the base 214, the pins 216a, 216b, 218a, 218b, 220a, and 220b may protrude from the package 212 as illustrated in FIG. 2A and FIG. 2B. The substrate 202 can further include a plurality of pin blocks 222 separated from the first circuit 202a. The selection of a material of the substrate 202 in the present embodiment may refer to the previous embodiment and will not repeated described.

Referring again to FIG. 3, the first power device 204 and the second power device 206 in the present embodiment are disposed on the first substrate 202, and at least one of the first power device 204 and the second power device 206 is disposed on the substrate via a flip chip bonding technology. The first power device 204 and the second power device 206 can be vertical power devices such as a first vertical MOSFET 204a, a first vertical MOSFET 204b, a second vertical MOSFET 206a, and a second vertical MOSFET 206b. In another embodiment, the vertical power device is, for instance, another field effect transistor controlled by voltage or current such as an insulated gate bipolar transistor or a high-electron mobility transistor (such as a gallium nitride transistor or a gallium oxide transistor). In the present embodiment, the first power device 204 and the second power device 206 can form a half-bridge rectifier. For instance, the first vertical MOSFET 204a and the second vertical MOSFET 206a are disposed on the first circuit 202b of the first substrate 202 and are directly electrically connected to each other via the first circuit 202b of the substrate 202 such that the first power device 204a and the second power device 206a form one half-bridge rectifier. In the present embodiment, when the source of the first vertical MOSFET 204a is in direct contact with the first circuit 202b, the drain of the second vertical MOSFET 206a is in direct contact with the first circuit 202b. In another embodiment, when the drain of the first vertical MOSFET 204a is in direct contact with the first circuit 202b, the source of the second vertical MOSFET 206a is in direct contact with the first circuit 202b. As a result, the first vertical MOSFET 204a and the second vertical MOSFET 206a do not need to be connected via an interconnect, and therefore parasitic inductance can be lower than that generated by connecting the power devices using an interconnect, and as a result power device response is less affected.

Similarly, when the source of the first vertical MOSFET 204b in FIG. 3 is in direct contact with the first circuit 202c, the drain of the second vertical MOSFET 206b is in direct contact with the first circuit 202c. Alternatively, when the drain of the first vertical MOSFET 204b is in direct contact with the first circuit 202c, the source of the second vertical MOSFET 206b is in direct contact with the first circuit 202c. Moreover, the first vertical MOSFET 204a can be electrically connected to the first circuit 202d via a conductive structure 224; the second vertical MOSFET 206a can be electrically connected to the first circuit 202a via a conductive structure 226; the first vertical MOSFET 204b can be electrically connected to the first circuit 202e via the conductive structure 224; and the second vertical MOSFET 206b can be electrically connected to the first circuit 202a via the conductive structure 226. In the present embodiment, the conductive structures 224 and 226 are, for instance, metal plates.

Referring further to FIG. 3, when a high current enters from the reference ground pin 216a, the current is transferred to the second vertical MOSFET 206a via the conductive structure 226 electrically connected to the first circuit 202a, and since the second vertical MOSFET 206a is in direct contact with the first circuit 202b, the current is transferred to the phase output pin 218a from the second vertical MOSFET 206a via the first circuit 202b to form an upper bridge circuit. Moreover, when a high current enters from the phase output pin 218a, since the first vertical MOSFET 204a is in direct contact with the first circuit 202b, the current is transferred to the first vertical MOSFET 204a via the first circuit 202b and the current is transferred to the power pin 220a of the first circuit 202d via the conductive structure 224 electrically connected to the first vertical MOSFET 204a to form a lower bridge circuit. Similarly, the second vertical MOSFET 206b and the first vertical MOSFET 204b also form an upper and lower bridge circuit. Therefore, the power device package structure 200 of the present embodiment can be applied in a power conversion unit, including a rectifier, an inverter, or a converter. The power device package structure 200 of the present embodiment can also be applied in a vehicle package structure of a power device such as the rectifier of a vehicle generator, a DC power converter, or a motor drive apparatus.

Referring further to FIG. 3, the insulation film 208 is disposed on the first circuit 202a of the substrate 202 and has a second circuit 228. The electronic component 210 is disposed on the insulation film 208. The electronic component 210 includes, for instance, a control IC, a protection circuit, an inductor, a capacitor, or a resistor, and although FIG. 3 only shows one electronic component 210, the disclosure is not limited thereto, and a plurality of electronic components 210 can also be disposed on the insulation film 208 as needed. The insulation film 208 in the present embodiment is used to electrically isolate the first circuit 202a and the electronic component 210, and can also block the high heat produced during the operation of the first power device 204 or the second power device 208. The selection of a material of the insulation film 208 in the present embodiment may refer to the previous embodiment and will not repeated described.

Moreover, the power device package structure 200 can also electrically connect the electronic component 210 to the first power device 204 or the second power device 206 via a conductor to send a control signal to the first power device 204 or the second power device 206. The conductor is, for instance, a metal wire (not shown) or a metal plate (not shown).

Referring further to FIG. 2B, the block 214a of the substrate 214 in the present embodiment is disposed right below the first vertical MOSFET 204b and the second vertical MOSFET 206b of FIG. 3, the block 214b is disposed right below the first vertical MOSFET 204a and the second vertical MOSFET 206a of FIG. 3, and the block 214c is disposed right below the insulation film 208 of FIG. 3, but the disclosure is not limited thereto. From the perspective of reducing the junction temperature of the first power device 204 and the second power device 206, the base 214 only needs to be disposed right below the first power device 204 and the second power device 206. In other words, the block 214c can be omitted. In FIG. 2B, a portion of the base 214 is exposed from the package 212, and the projected area of the base 214 does not exceed the package 212. The selection of a material of the base 214 may refer to the previous embodiment and will not repeated described. The package 212, for instance, encapsulates the substrate 202, the first power device 204, the second power device 206, the electronic component 210, and the base 214 via a molding process. In the present embodiment, the selection of a material of the package 212 may refer to the previous embodiment and will not repeated described.

Based on the above, since the first power device and the second power device in the power device package structure of the disclosure are directly electrically connected via the substrate, the issue of increased parasitic inductance generated by traditional wiring does not occur, and as a result power module response is not affected. For instance, the parasitic inductance of an interconnect adopting a wire bonding is roughly between 1 nH and 5 nH due to metal wires. In an embodiment of the disclosure, the first power device is disposed on the substrate via a flip chip bonding technology such that the source of the first power device and the drain of the second power device are in contact with the first circuit of the substrate at the same time, and the source of the first power device and the drain of the second power device are directly electrically connected via the substrate, and thus the parasitic inductance between the first power device and the second power device may be less than 1 nH. Moreover, in the disclosure, an insulation film is disposed below the electronic component, and influence to the electronic component during the operation of the power device can be reduced. Moreover, a base having high heat capacity is disposed below the substrate, and the effect of reducing the transient-state thermal resistance of the power device package structure can be further achieved. Therefore, the power device package structure of the disclosure is suitable for the rectifier of a high-power vehicle generator, a DC power converter, or a motor drive apparatus.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power device package structure, comprising:
   a substrate consisting of a plurality of first circuits isolated from one another;
   a first power device and a second power device disposed on one of the plurality of first circuits, wherein the first power device and the second power device are directly electrically connected to each other via the one of the plurality of first circuits;
   an insulation film disposed on the substrate and having a second circuit;
   at least one electronic component disposed on the insulation film, wherein the at least one electronic component is electrically isolated from the substrate, the first power device and the second power device through the insulation film; and
   a package encapsulating the substrate, the first power device, the second power device, and the at least one electronic component.

2. The power device package structure of claim 1, wherein the at least one electronic component comprises a control IC, a protection circuit, an inductor, a capacitor, or a resistor.

3. The power device package structure of claim 1, further comprising a plurality of conductors electrically connecting the at least one electronic component to the first power device or the second power device.

4. The power device package structure of claim 3, wherein each of the plurality of conductors is a metal wire or a metal plate.

5. The power device package structure of claim 1, wherein at least one of the first power device and the second power device is a vertical power device.

6. The power device package structure of claim 1, wherein at least one of the first power device and the second power device is a field effect transistor controlled by voltage or current.

7. The power device package structure of claim 1, wherein at least one of the first power device and the second power device comprises a metal oxide semiconductor field effect transistor, an insulated gate bipolar transistor, or a high electron mobility transistor.

8. The power device package structure of claim 1, wherein the first power device and the second power device form a bridge circuit, and the bridge circuit comprises a half-bridge circuit, a full-bridge circuit, or a totem pole circuit.

9. The power device package structure of claim 1, wherein at least one of the first power device and the second power device is disposed on the substrate via a flip chip bonding technology.

10. The power device package structure of claim 1, wherein a material of the substrate comprises copper, aluminum, lithium, gold, silver, diamond, graphene, or an alloy compound thereof.

11. The power device package structure of claim 1, further comprising a base disposed below the substrate, wherein a heat capacity of the base is greater than a heat capacity of the substrate.

12. The power device package structure of claim 11, wherein a material of the base comprises copper, aluminum, lithium, gold, silver, diamond, graphene, or an alloy compound thereof.

13. The power device package structure of claim 11, wherein a portion of the base is exposed from the package.

14. The power device package structure of claim 1, wherein the power device package structure is a power conversion unit applied in a rectifier, an inverter, or a converter.

15. The power device package structure of claim 1, wherein the power device package structure is applied in a vehicle power conversion system, and the vehicle power conversion system comprises a vehicle generator rectifier, a DC power converter, or a motor drive apparatus.

* * * * *